(12) United States Patent
Bailey et al.

(10) Patent No.: US 10,391,740 B2
(45) Date of Patent: Aug. 27, 2019

(54) ADAPTIVE MATERIAL ARTICLE SYSTEM

(71) Applicant: NIKE, Inc., Beaverton, OR (US)

(72) Inventors: Collin Bailey, Beaverton, OR (US);
Rebecca P. Hurd, Tigard, OR (US);
Matthew D. Nordstrom, Portland, OR (US); Patrick Williams, Portland, OR (US); Olivia A. Echols, Portland, OR (US); Ryan P. Henry, Beaverton, OR (US); Stewart D. Horner, Portland, OR (US)

(73) Assignee: NIKE, Inc., Beaverton, OR (US)

( * ) Notice: Subject to any disclaimer, the term of this patent is extended or adjusted under 35 U.S.C. 154(b) by 517 days.

(21) Appl. No.: 15/045,370

(22) Filed: Feb. 17, 2016

(65) Prior Publication Data

US 2016/0243792 A1 Aug. 25, 2016

Related U.S. Application Data

(60) Provisional application No. 62/118,288, filed on Feb. 19, 2015.

(51) Int. Cl.
*B32B 5/26* (2006.01)
*B32B 7/02* (2019.01)
(Continued)

(52) U.S. Cl.
CPC .............. *B32B 7/02* (2013.01); *A41D 13/002* (2013.01); *A41D 27/28* (2013.01); *A41D 31/02* (2013.01);
(Continued)

(58) Field of Classification Search
CPC ............................... A41D 27/28; A41D 31/125
See application file for complete search history.

(56) References Cited

U.S. PATENT DOCUMENTS

| 415,676 A | 11/1889 | Rhodes |
| 948,142 A | 2/1910 | Karp |
| (Continued) | | |

FOREIGN PATENT DOCUMENTS

| CA | 2464718 C | 5/2003 |
| EP | 1640488 A1 | 3/2006 |
| (Continued) | | |

OTHER PUBLICATIONS

Non-Final Office Action dated Aug. 26, 2016 in U.S. Appl. No. 15/045,465, 17 pages.
(Continued)

*Primary Examiner* — William P Watkins, III
(74) *Attorney, Agent, or Firm* — Shook, Hardy & Bacon LLP

(57) ABSTRACT

An adaptive material garment system includes a number of components to effectively transport and exhaust moisture and thermal energy while protecting the wearer from undesired levels of air permeability. Therefore, an adaptive material responsive to stimuli, such as moisture, is used as a base layer against a wearer's skin. The base layer is effective to transport thermal energy and/or sweat away from the skin. The base layer may be formed with a first gauge greater than and a denier that is less than an outer article. The outer article may also be formed from an adaptive material responsive to the same or different stimuli. The outer article may also have a wind-resistant panel having apertures and a selectively coupled perimeter.

17 Claims, 4 Drawing Sheets

(51) Int. Cl.
*A41D 31/02* (2019.01)
*A41D 27/28* (2006.01)
*A41D 13/002* (2006.01)
*A41D 31/12* (2019.01)
*A41D 31/06* (2019.01)

(52) U.S. Cl.
CPC .............. *A41D 31/125* (2019.02); *B32B 5/26* (2013.01); *A41D 31/065* (2019.02); *B32B 2250/03* (2013.01); *B32B 2250/20* (2013.01); *B32B 2307/724* (2013.01); *B32B 2437/00* (2013.01)

(56) References Cited

U.S. PATENT DOCUMENTS

| | | | |
|---|---|---|---|
| 1,012,648 | A | 12/1911 | Karp |
| 4,034,417 | A | 7/1977 | Ellis |
| 4,344,999 | A | 8/1982 | Gohlke |
| 4,454,191 | A | 6/1984 | Von Bluecher et al. |
| 4,530,873 | A | 7/1985 | Okada |
| 4,569,874 | A | 2/1986 | Kuznetz |
| 4,756,027 | A | 7/1988 | Buenos et al. |
| 4,868,928 | A | 9/1989 | Norvell |
| 5,035,000 | A | 7/1991 | Matthias |
| 5,204,156 | A | 4/1993 | Lumb et al. |
| 5,378,529 | A | 1/1995 | Bourdeau |
| 5,815,837 | A | 10/1998 | Christman et al. |
| 5,953,758 | A | 9/1999 | Foster |
| 6,332,221 | B1 | 12/2001 | Gracey |
| 6,432,504 | B1 | 8/2002 | Yeh |
| 6,511,927 | B1 | 1/2003 | Ellis et al. |
| 7,168,098 | B2 | 1/2007 | West |
| 7,560,399 | B2 | 7/2009 | Rock et al. |
| 7,682,994 | B2 | 3/2010 | Van Emden et al. |
| 7,856,669 | B2 | 12/2010 | Sommers et al. |
| 8,187,984 | B2 | 5/2012 | Rock |
| 8,192,824 | B2 | 6/2012 | Rock et al. |
| 8,349,438 | B2 | 1/2013 | Laib et al. |
| 8,454,784 | B2 | 6/2013 | Colasanto et al. |
| 8,601,612 | B2 | 12/2013 | Funk-Danielson |
| 9,032,550 | B2 | 5/2015 | Lambertz et al. |
| 9,060,551 | B2 | 6/2015 | Nordstrom et al. |
| 9,090,998 | B2 | 7/2015 | Williams |
| 2004/0132367 | A1 | 7/2004 | Rock |
| 2005/0208857 | A1 | 9/2005 | Baron et al. |
| 2006/0000005 | A1 | 1/2006 | Foreman |
| 2006/0035555 | A1 | 2/2006 | Narayanan et al. |
| 2007/0093162 | A1 | 4/2007 | Holcombe et al. |
| 2011/0119811 | A1 | 5/2011 | Rock et al. |
| 2012/0174291 | A1 | 7/2012 | Fraze |
| 2012/0178343 | A1 | 7/2012 | Hurd et al. |
| 2012/0233738 | A1 | 9/2012 | Blauer et al. |
| 2012/0276332 | A1 | 11/2012 | Conolly et al. |
| 2014/0004295 | A1 | 1/2014 | Kiederle |
| 2014/0087104 | A1 | 3/2014 | Kierderle et al. |
| 2014/0090144 | A1 | 4/2014 | Gilreath |
| 2014/0157482 | A1 | 6/2014 | Blauer et al. |
| 2014/0189935 | A1 | 7/2014 | Tucker |
| 2014/0304896 | A1 | 10/2014 | Nordstrom et al. |
| 2015/0104604 | A1 | 4/2015 | Rock et al. |
| 2015/0106992 | A1 | 4/2015 | Blakely et al. |
| 2015/0351458 | A1 | 12/2015 | Fisher et al. |

FOREIGN PATENT DOCUMENTS

| | | |
|---|---|---|
| WO | 9905926 A1 | 2/1999 |
| WO | 2010091880 A1 | 8/2010 |
| WO | 2012085454 A1 | 6/2012 |
| WO | 2012136962 A1 | 10/2012 |

OTHER PUBLICATIONS

International Preliminary Report on Patentability dated Aug. 31, 2017 in International Patent Application No. PCT/US2016/018730, 8 pages.
International Search Report and Written Opinion dated May 19, 2016 for PCT Application No. PCT/US2016/018730, 11 pages.
"Arcteryx M Gamma LT Jacket Mens lightweight elastic softshell jacket," Product No: AXH10264, Outdoor Sports 24, outdoorsports24. com, Accessed Aug. 2015. http://www.outdoorsports24.com/Yoursports/Climbing/ClothingMen/ArcteryxMGAMMALTJACKETMenslightweightelasticsoftshelljacket310438.html.
"Stone Island Marina Heat Reactive Jacket," End, endclothing.com, © 2015 Ashworth and Parker Ltd., accessed: Aug. 2015. http://www.endclothing.com/us/stoneislandmarinaheatreactivejacket.html.

ADAPTIVE MATERIAL ARTICLE SYSTEM

CROSS-REFERENCE TO RELATED APPLICATIONS

This application entitled "Adaptive Material Article System" claims priority to U.S. Provisional App. No. 62/118,288; filed Feb. 19, 2015, and entitled "Adaptive Material Garment System." The entirety of the aforementioned application is incorporated by reference herein.

BACKGROUND

Adaptive materials are materials that respond to a stimulus, such as moisture or thermal energy. In response to the stimulus, a physical change occurs with the adaptive material. For example, the adaptive material may expand, contract, swell, or shrink in length, width, and/or thickness. The adaptive material may change at a yarn level or at the material level.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The present invention is defined by the claims.

An exemplary aspect provided herein is an adaptive material garment system comprising an inner article, such as a base layer. The inner article may be any article, such as a shirt, pant, short, sock, glove, or the like. In an exemplary aspect, the inner article is intended to contact the skin of the wearer as a first layer in a system. The inner article is comprised of a first adaptive material having a first denier per yarn and responsive to a first triggering stimulus. In an exemplary aspect, the denier per yarn is selected to provide an appropriate adaptive response to the stimuli while still providing a sufficient feel against a wear's skin. With respect to the stimulus, it is contemplated that the stimulus may be moisture generated by a wearer, e.g., sweat. Additionally, it is contemplated that the stimulus is thermal energy emitted by the wearer, in another exemplary aspect.

Continuing with this example, the adaptive material garment system is further comprised of an outer article configured to be layered over the inner article. For example, a jacket, coat, over shirt, over pant, footwear, glove, and the like is contemplated. In an exemplary aspect, the outer article is exposed to the outside environment when worn by a user. The outer article is comprised of a first layer having an inner surface and an opposite outer surface and formed from a second adaptive material. The second adaptive material may be the same or different from the first adaptive material of the inner article. In an exemplary aspect, the second adaptive material is responsive to a similar stimulus but has a different denier and/or gauge from the first adaptive material. In an exemplary aspect, the second adaptive material has a second denier per yarn that is greater than the first denier per yarn. Further, it is contemplated that the second adaptive material is responsive to a second triggering stimulus. Additionally, it is contemplated that the inner article has a higher gauge (e.g., stitches per inch) than the outer article. This discrepancy in gauge facilitates a sufficient transport mechanism and feel to abrasion differential.

The outer article is further comprised of a second layer having an inner surface and an opposite outer surface. The second layer inner surface is adjacent to the first layer outer surface such that the second layer and the first layer are coupled in a first location and not coupled in a second location. For example, it is contemplated that at a lower portion of the outer article, the second layer is not coupled with the first layer to allow for air circulation to evacuate higher humidity air formed between the first layer and the second layer as a result of the adaptive materials transporting moisture from the wearer's body. Further, it is contemplated that the second layer has lower air permeability than the first layer. In an exemplary aspect, the second layer is sized and positioned on the outer garment to resist oncoming airflow, such as that air flow experienced when a wearer is running or active in a forward direction. In this example, the lower air permeability second material reduces air permeability of the adaptive garment system as a whole at the anterior portion experiencing the prevailing air flow.

While these aspects are provided here for reference, they are not limiting as to the scope of the following disclosure and claims.

BRIEF DESCRIPTION OF THE DRAWINGS

The present invention is described in detail herein with reference to the attached drawing figures, wherein.

DETAILED DESCRIPTION

Figure 1:
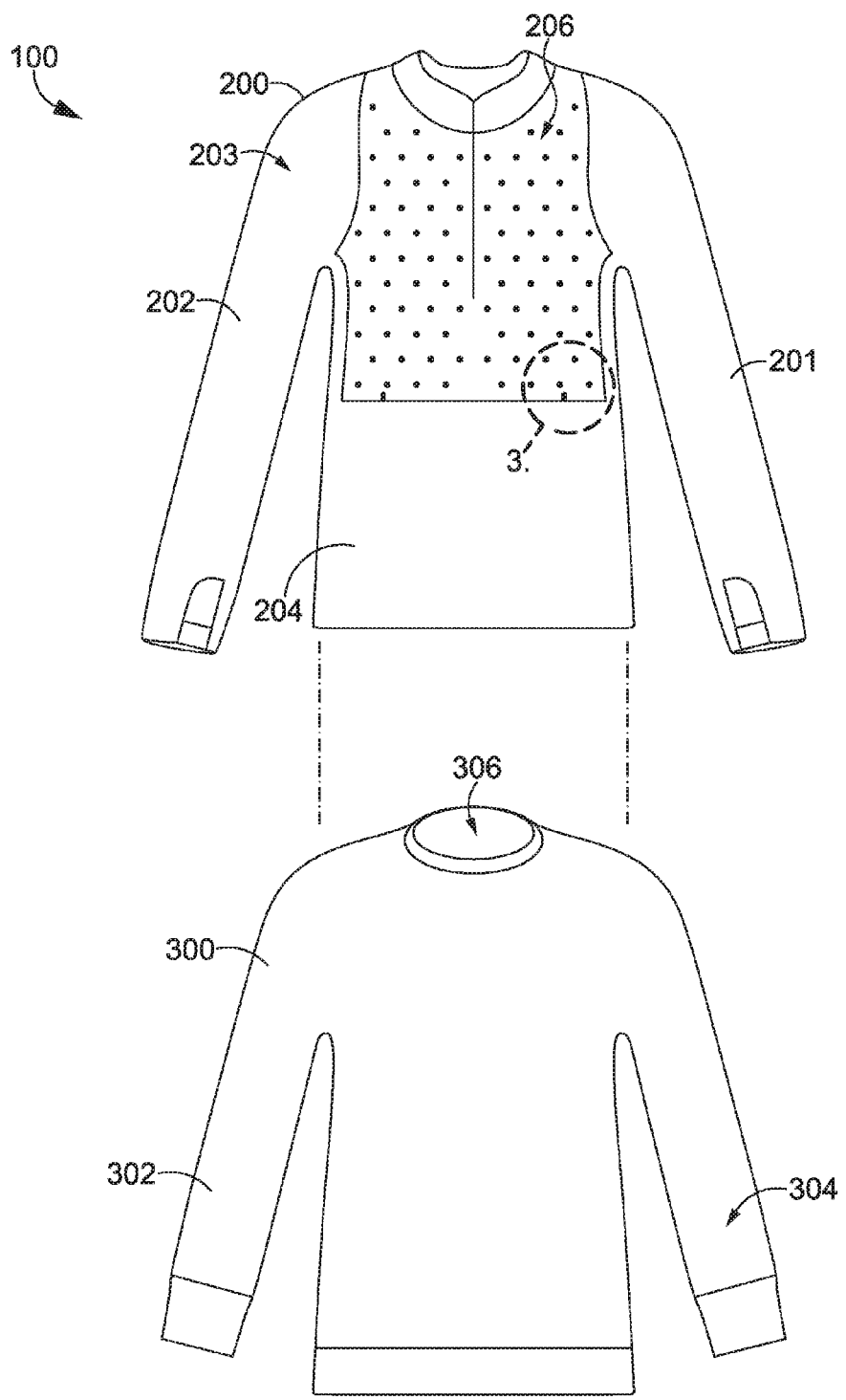
FIG. 1 depicts an exploded view of an adaptive material garment system in accordance with an aspect hereof.

An exemplary aspect provided herein is an adaptive material garment system comprising an inner article, such as a base layer. The inner article may be any article, such as a shirt, pant, short, sock, glove, or the like. In an exemplary aspect, the inner article is intended to contact the skin of the wearer as a first layer in a system. The inner article is comprised of a first adaptive material having a first denier per yarn and responsive to a first triggering stimulus. In an exemplary aspect, the denier per yarn is selected to provide an appropriate adaptive response to the stimuli while still providing a sufficient feel against a wear's skin. With respect to the stimulus, it is contemplated that the stimulus may be moisture generated by a wearer, e.g., sweat. Additionally, it is contemplated that the stimulus is thermal energy emitted by the wearer, in another exemplary aspect.

Continuing with this example, the adaptive material garment system is further comprised of an outer article configured to be layered over the inner article. For example, a jacket, coat, over shirt, over pant, footwear, glove, and the like is contemplated. In an exemplary aspect, the outer article is exposed to the outside environment when worn by a user. The outer article is comprised of a first layer having an inner surface and an opposite outer surface and formed from a second adaptive material. The second adaptive material may be the same or different from the first adaptive material of the inner article. In an exemplary aspect, the second adaptive material is responsive to a similar stimulus but has a different denier and/or gauge from the first adaptive material. In an exemplary aspect, the second adaptive material has a second denier per yarn that is greater than the first denier per yarn. Further, it is contemplated that the second adaptive material is responsive to a second triggering stimulus.

The outer article is further comprised of a second layer having an inner surface and an opposite outer surface. The second layer inner surface is adjacent to the first layer outer surface such that the second layer and the first layer are coupled in a first location and not coupled in a second location. For example, it is contemplated that at a lower portion of the outer article, the second layer is not coupled with the first layer to allow for air circulation to evacuate higher humidity air formed between the first layer and the second layer as a result of the adaptive materials transporting moisture from the wearer's body. Further, it is contemplated that the second layer has lower air permeability than the first layer. In an exemplary aspect, the second layer is sized and positioned on the outer garment to resist oncoming airflow, such as that air flow experienced when a wearer is running or active in a forward direction. In this example, the lower air permeability of the second material reduces air permeability of the adaptive garment system as a whole at the anterior portion experiencing the prevailing air flow.

A differential in the denier per yarn of the inner article as compared to the outer article provides unexpected results in exemplary aspects. In particular, having a lower denier at the inner article allows for an improved moisture and heat transport while being comfortable to a user. The higher denier at the outer article provides sufficient transport of the moisture and thermal energy through the adaptive materials. For example, because the outer layer is removed from direct contact with the skin, the higher denier adaptive material is more responsive at lower stimulus levels that result from separation with the human body by the inner article than the inner article, in an exemplary aspect. Stated differently, because the inner article is closest to a source of a stimuli, the inner article reactions with a smaller denier are sufficient to achieve a desired result. The outer article, which is separated from the stimuli source by the inner article, is more responsive, in an exemplary aspect, because of the higher denier. Therefore, the layered varied denier materials act in cooperation to achieve a unified effect with different stimulus levels, in an exemplary aspect.

As used throughout this disclosure, the term "adaptive material" generally comprises some type of bi-component yarn having a reactive component (e.g., fiber) and a non-reactive component (e.g., fiber). However, it is contemplated herein that the yarn may comprise additional components (e.g., tri-component yarn, multi-component yarn, and the like) having different percentages/ratios of reactive and non-reactive components. In another example, the adaptive material may comprise a single component reactive yarn that is used along with, or is inter-knitted or inter-woven with, non-reactive yarns. In exemplary aspects, the non-reactive component may comprise, for example, polyester (such as a cationic dyeable polyester), nylon, cotton, and the like. Further, in exemplary aspects, the adaptive yarn may be formed by spinning nylon and polyester fibers side-by-side.

In exemplary aspects, in response to a stimulus such as moisture, heat, and/or pressure the adaptive material undergoes a change from a first physical state to a second physical state. For instance, in the first physical state, the bi-component yarn may exist in a crimped state and after exposure to the stimulus, the adaptive yarn may exist in a flat or uncrimped state. The transition from the first physical state to the second physical state may occur rapidly. For instance, the transition may occur in under 30 seconds. In some exemplary aspects, the amount of crimping in the first physical state may be controlled by varying the physical properties of the adaptive yarn (e.g., increasing the percentage of the reactive component). Continuing, in other exemplary aspects, the adaptive yarn may become crimped after being incorporated into a fabric. In some instances, this may be due to the knitting (e.g., single knit or double knit) and/or weaving process used to form the fabric, and in other instances, the crimping may be in response to, for instance, a dyeing process.

FIG. 1 depicts an exploded view of an adaptive material garment system 100 in accordance with an aspect hereof. The system 100 is comprised of an inner article 300 (e.g., base layer) and an outer article 200. The base layer inner article 300 may comprise a knitted or woven construction formed in whole or in part of a first adaptive material. The first adaptive material is responsive to one or more stimuli. For example, it is contemplated that in response to moisture from the wearer's sweat/perspiration and/or the wearer's heat, the first adaptive material physically changes. The physical changes, in an exemplary aspect, results in a greater breathability of the inner article. For example, the inner article 300 may be formed with a knit or woven construction using an adaptive material such that one or more apertures formed therein expand in response to the moisture and/or heat. The increase in the aperture size, which allows for a greater transmission of air, may be the result of an uncrimping of the yarns forming the knit or woven structure that causes the apertures to increase in size. In other words, the uncrimping may loosen the knit or woven structure causing the apertures to open. Regardless of the structural mechanism, in response to stimuli, it is contemplated that the inner article 300 achieves a higher air permeability than prior to being exposed to the stimuli, in an exemplary aspect.

The inner article 300 is depicted as a shirt in FIG. 1. However, it is contemplated that the inner article may be any article, such as a pant, glove, sock, or the like. The inner article 300 is depicted with a first sleeve 302, a second sleeve 304, and a neck hole 306.

As the inner article 300 is contemplated as a base layer having direct contact with a wearer's skin, it is contemplated that it is formed from a material that is acceptable for contact against the skin. For example, the yarn forming the inner article 300 may have a denier of 40-60 per yarn. In an exemplary aspect, the yarn forming at least a portion of the inner article 300 is about 50 denier (e.g., 47-53 denier). Further, it is contemplated that the formation of the first adaptive material is suitable for contact with the skin. For example, a knit stitch technique or a weaving technique that provides a sufficient feel may be selected.

The outer article 200 is contemplated as overlapping and over laying the inner article 300, as depicted hereinafter at FIG. 2. The outer article 200 is comprised of a first material layer 203 and a second material layer 206. In an exemplary aspect, the first layer 203 may be of a knitted or woven construction formed using an adaptive material (a fiber or yarn) that is responsive to a stimulus, such as moisture or thermal energy. The first layer 203 may be formed having a denier per yarn of 65-85. In an exemplary aspect, the first layer 203 is formed from a material having about a 75 denier per yarn. The second layer 206 may comprise a knitted or woven wind-resistant material having lower air permeability than the first layer 203, in an exemplary aspect. In exemplary aspects, the second layer 206 may be formed without use of the adaptive material (e.g., formed using only nylon, polyester, cotton, spandex yarns and the like). Further, as will be discussed hereinafter, it is contemplated that the second layer is comprised of a plurality of apertures extending there through that are effective to help in the evacuation of higher (relative to ambient air) moisture and/or temperature air from between the first layer 203 and the second layer 206. Further, as will be discussed hereinafter in greater detail, it is contemplated that the first layer 203 and the second layer 206 are coupled (e.g., sewn, welded, adhered) to one another in a first location but not in a second location. For example, the perimeter of the second layer 206 may be coupled with the first layer 203 except at one or more inferior locations of the perimeter. This selective coupling, in an exemplary aspect, allows for efficient and controlled movement of air out of a volume or space formed between the first layer 203 and the second layer 206, in an exemplary aspect.

As depicted in FIG. 1, the outer article 200 is an article for covering an upper portion of the wearer, such as a coat, shirt, or the like. Therefore, the outer article 200 is comprised of a first sleeve 201, a second sleeve 202 and a neck opening disposed there between. A zoomed portion 3 will be discussed in FIG. 3 hereinafter.

The adaptive material layer concept having two or more layers of adaptive material and an outer layer formed from a non-adaptive material for air permeability resistance is contemplated to allow the movement of heat and moisture away from the wearer's body while preventing a prevailing wind from permeating the system in an undesired amount. In an exemplary aspect, the adaptive material may have a higher air permeability (e.g., four times the air permeability) of a non-adaptive material. Therefore, the advantages of an adaptive material to move moisture or heat away from a body may be counterproductive as it results in a higher air permeability, which may cause unwanted cooling in one or more locations. Therefore, the system concept provided here allows for a skin-contacting material to be used in the formation of the base layer (e.g., inner article 300) and a first layer of an outer garment may be formed from a more abrasion-resistant material that is also adaptive, but not as suitable, in an aspect, for contact with the skin. This outer article first layer further allows for the movement of thermal energy and/or moisture away from the wearer and towards the ambient environment while providing a robustness needed for an exterior article. In the system, it is contemplated that portions of the outer article that are traditionally exposed to prevailing winds (e.g., anterior portions corresponding to the wearer's chest for forward-moving activities) may incorporate a wind-resistant material. However, the wind-resistant material may be augmented with one or more apertures to allow for a controlled permeability of air to assist in the evacuation of the heat and/or moisture transported through the inner article 300 and the first layer of the outer article 200.

Figure 2:
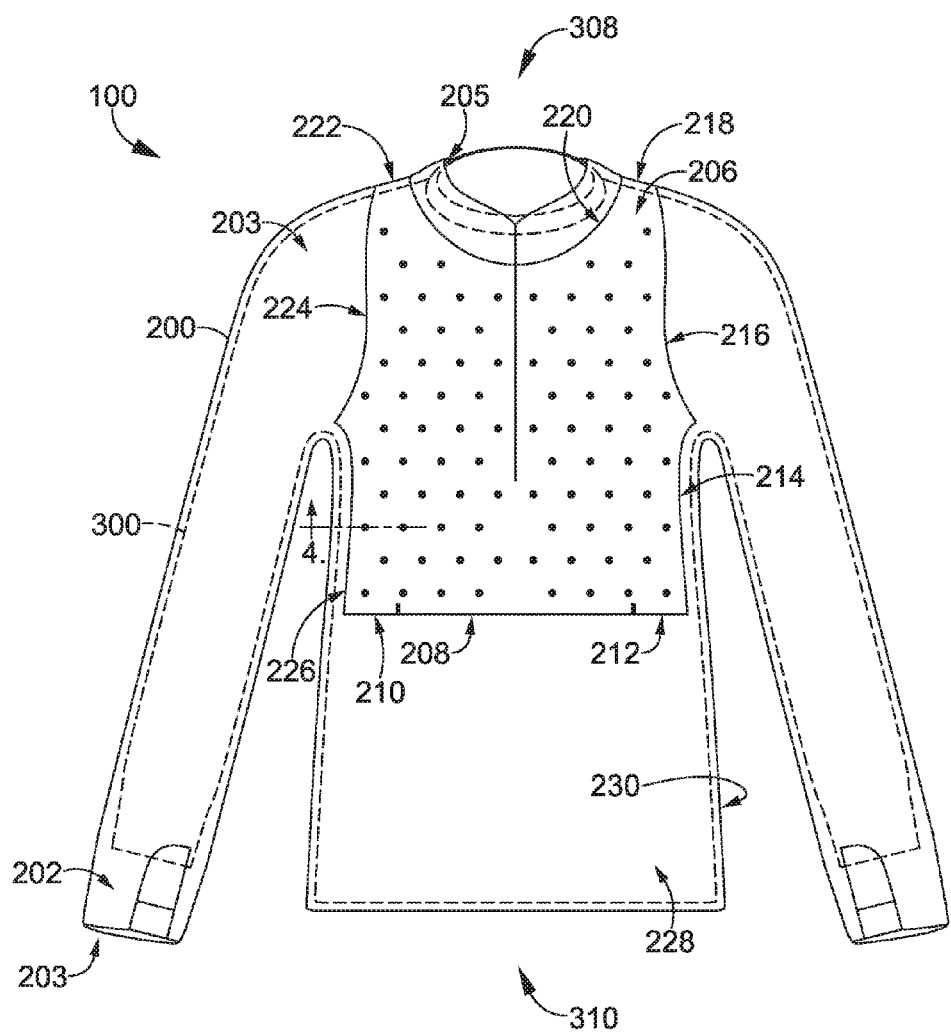
FIG. 2 depicts the adaptive material garment of FIG. 1 in accordance with an aspect hereof.

FIG. 2 depicts the system 100 of FIG. 1 in an as-worn configuration, in accordance with aspects herein. In this example, the inner article 300 is overlaid by the outer article 200. While a specific relational size is depicted, it is understood that there may be more or less overlap between the inner article 300 and the outer article 200, and FIG. 2 is not intended to be limiting.

The outer article 200 is depicted extending from a superior location 308 proximate a neck opening 211 to an inferior location 310, which will be used herein to provide relative positional terminology. Similarly, the system 100 has an anterior side 228 that is configured to be worn on an anterior portion of the wearer. Further, the system 100 has a posterior side 230 (not shown in FIG. 2) that is configured to be worn at a posterior side of the wearer. Additionally, terminology of distal and proximal may be used herein to define a relative location. Similar to human anatomical definitions, a distal end is further from a connection point than a proximal end. For example, a cuff edge is at a distal end of a sleeve, in an exemplary aspect.

FIG. 2 illustrates a perimeter of the second layer 206. The perimeter is defined at least by edges 210, 208, 212, 214, 216, 218, 220, 222, 224, and 226, in this example. It is contemplated that perimeter edges 208, 210, and 212 define an inferior edge of the second layer 206. This inferior edge is depicted as a linear segment; however, it is contemplated that it may form an upward angled edge converging on a center line (forming an inverted V-shape or the like) or a downward angled edge converging on a center line (forming a V-shape or the like). Further, it is contemplated that the inferior edge may be curved or otherwise formed. In an exemplary aspect, it is contemplated that perimeter edges 210 and 212 are coupled with the first layer 203 of the outer article 200 while the perimeter edge 208 is not coupled with the first layer 203. Each of perimeter edges 210 and 212 may be of a length ranging from 1 centimeter to 10 centimeters. In an exemplary aspect, the length of perimeter edges 210 or 212 is less than 25% a length from edge 226 to edge 214, in an exemplary aspect, to provide sufficient exhaust capacity from the perimeter edge 208. This uncoupled perimeter edge 208 provides an exhaust opening for evacuating humid or warm air that may form between the first layer 203 and the second layer 206 while preventing gravity-fed rain or other debris from entering the cavity formed between the first layer 203 and the second layer 206, in an exemplary aspect.

Further, it is contemplated that the bonding of a portion of the inferior edge at edges 210 and 212 provides strength to the bonding between the first layer 203 and the second layer 206 as well as deflection control of the second layer 206 extending away from the first layer 203 due to wind or other forces acting on the second layer 206. It is further contemplated that the second layer 206 is coupled with the first layer 203 at all or some of the remaining perimeter edges (e.g., edges 210, 212, 214, 216, 218, 220, 222, 224, and 226 are coupled with the first layer 203). It is contemplated that an interior area formed by the perimeter of the second layer 206 is void of being coupled with (e.g., is uncoupled from) the first layer 203, in an exemplary aspect. Further, it is contemplated that a plurality of couplings are positioned in the area bounded by the perimeter of the second layer 206 to maintain the second layer 206 from billowing or extending away from the first layer 203. The inclusion of a plurality of couplings may also prevent a flapping of the second layer 206 relative to the first layer 203. The flapping, if not prevented, may result in an increase in wind resistance, in an exemplary aspect.

Figure 3:
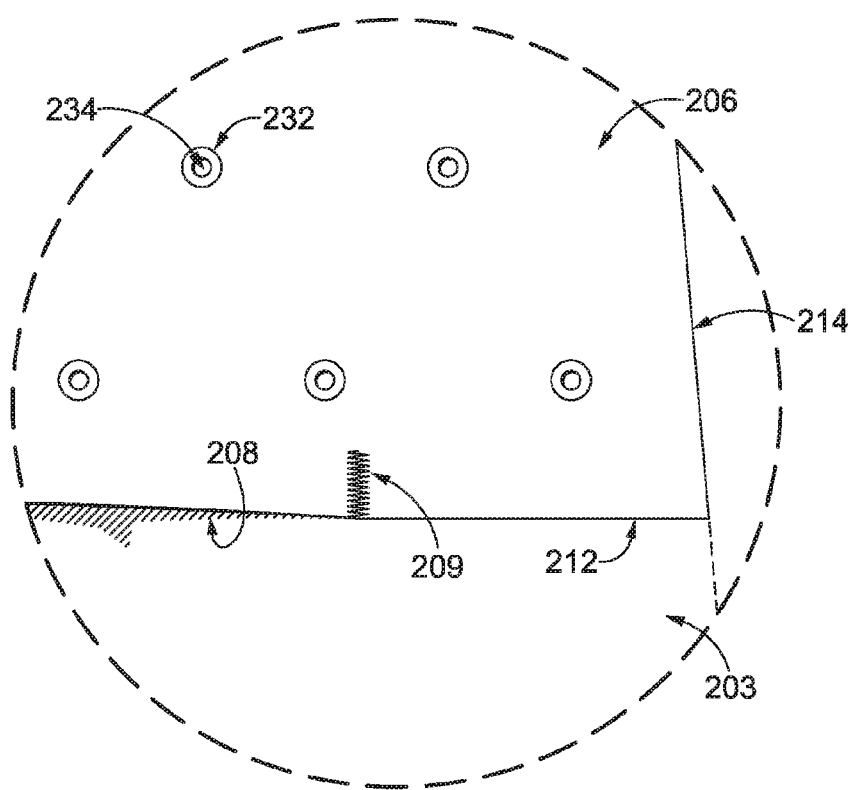
FIG. 3 depicts a zoomed view of the outer layer having a first and a second layer selectively coupled in accordance with an aspect hereof.

FIG. 3 depicts a zoomed view 3 of the outer article 200 having the first layer 203 and the second layer 206 selectively coupled in accordance with an aspect hereof. For example, the second layer 206 is coupled to the first layer 203 at edge 214 and perimeter edge 212. However, at perimeter edge 208, the second layer 206 is depicted as not being coupled to (e.g., separate from) the first layer 203. As a result, the second layer 206 is able to move independently of the first layer 203 along the perimeter edge 208. It is contemplated that reinforcement 209 may be used at the intersection of a coupled segment and an uncoupled segment of the perimeter. In this example, the reinforcement 209 is a bar-like tack extending through the first layer 203 and the second layer 206 that is effective to prevent unintended separations of coupled segments.

Further depicted in FIG. 3 are apertures 234. The apertures 234 extend through the second layer 206. The apertures 234 may be reinforced with a reinforcement element 232, in an exemplary aspect. It is contemplated that the reinforcement element 232 may be adhered, sewn, or otherwise bonded with a surface of the second layer 206. For example, it is contemplated that the reinforcement element 232 is formed from a silicone material printed or otherwise applied to the surface. Further, it is contemplated that the reinforcement element 232 is an overlay formed from a polymeric material, such as thermo polyurethane (TPU) that is adhered with an additional agent or adhered through a coupling of the TPU to the surface by pressure and heat. Additionally, the reinforcement elements 232 may comprise, for instance, a grommet-type structure formed from plastic, rubber, metal, and the like.

In exemplary aspects, the reinforcement element 232 may be first applied to the surface and the apertures 234 are formed through the second layer 206 and the reinforcement element 232 simultaneously. Further, it is contemplated that the aperture 234 is first formed through the second layer 206 and then the reinforcement element 232 is applied thereafter to surround the aperture 234. In an exemplary aspect, the reinforcement element 232 extends beyond the outer perimeters of the apertures 234 such that an enlargement of the apertures 234 would result in an enlargement of the reinforcement element 232, in an exemplary case. The reinforcement element 232 may also provide additional function with reflective characteristics to enhance visual perception or with contoured elements that provide aerodynamic efficiencies, in exemplary aspects. The reinforcement element 232 may be effective to prevent unintentional enlargement of the aperture 234. The apertures 234 may have any diameter. In an exemplary aspect, the apertures 234 have a diameter between 1 and 3 millimeters. Further, the spacing distance between a first and a second aperture 234 may be between 20 and 80 millimeters, in an exemplary aspect.

In exemplary aspects, leaving a portion of the second layer 206 perimeter separate from the first layer 203 provides equivalent evaporative resistance to having the entire perimeter coupled, but having the uncoupled segment reduces thermal resistance of the system by 5% relative to a system in which the entire perimeter is coupled, in an exemplary aspect. Similarly, a difference between inclusion of apertures and omission of the apertures affects the function of the system. For example, omission of the apertures results in an increase in thermal resistance as compared to the configuration with apertures included. As an increase in thermal resistance may not be desired in an article attempting to evacuate thermal energy, the inclusion of an uncoupled segment along a perimeter and apertures is implemented in an exemplary aspect.

Figure 4:
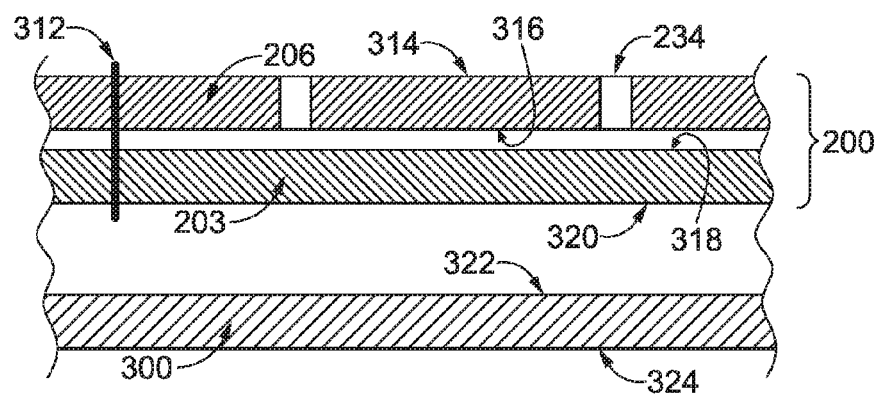
FIG. 4 depicts a cross-sectional view of the adaptive material garment system of FIG. 2 in accordance with an aspect hereof.

FIG. 4 depicts a cross-sectional view along line 4 of the adaptive material garment system 100 of FIG. 2 in accordance with an aspect hereof. In particular, the outer article 200 having the first layer 203 and the second layer 206 is depicted. The first layer 203 is comprised of an inner surface 320 and an outer surface 318. The second layer 206 is comprised of an inner surface 316 and an outer surface 314. The first layer 203 and the second layer 206 are coupled by way of a coupling 312, in this example. The coupling 312 is depicted as a stitch-like coupling extending through the layers 203 and 206; however, it is contemplated that a surface adhesive, weld, or other coupling mechanism may be implemented to couple the first layer 203 to the second layer 206, in an exemplary aspect. A gap is depicted between the first layer 203 and the second layer 206 to illustrate that they are free-to-move relative to each other, in this example. Further, while the cross section depicts the first layer 203 as a solid-like material, it is for illustrative purposes only as it is contemplated that the first layer 203 is a knit or woven material have a plurality of aperture-like voids formed in response to a stimulus. Similarly, it is contemplated that the second layer 206 may comprise a woven material, in an exemplary aspect.

The inner article 300 is depicted having an inner surface 324 and an outer surface 322. As the inner article 300 is contemplated as an independent article separate from the outer article 200, in an exemplary aspect, a gap is depicted there between for illustrative purposes.

Figure 5:
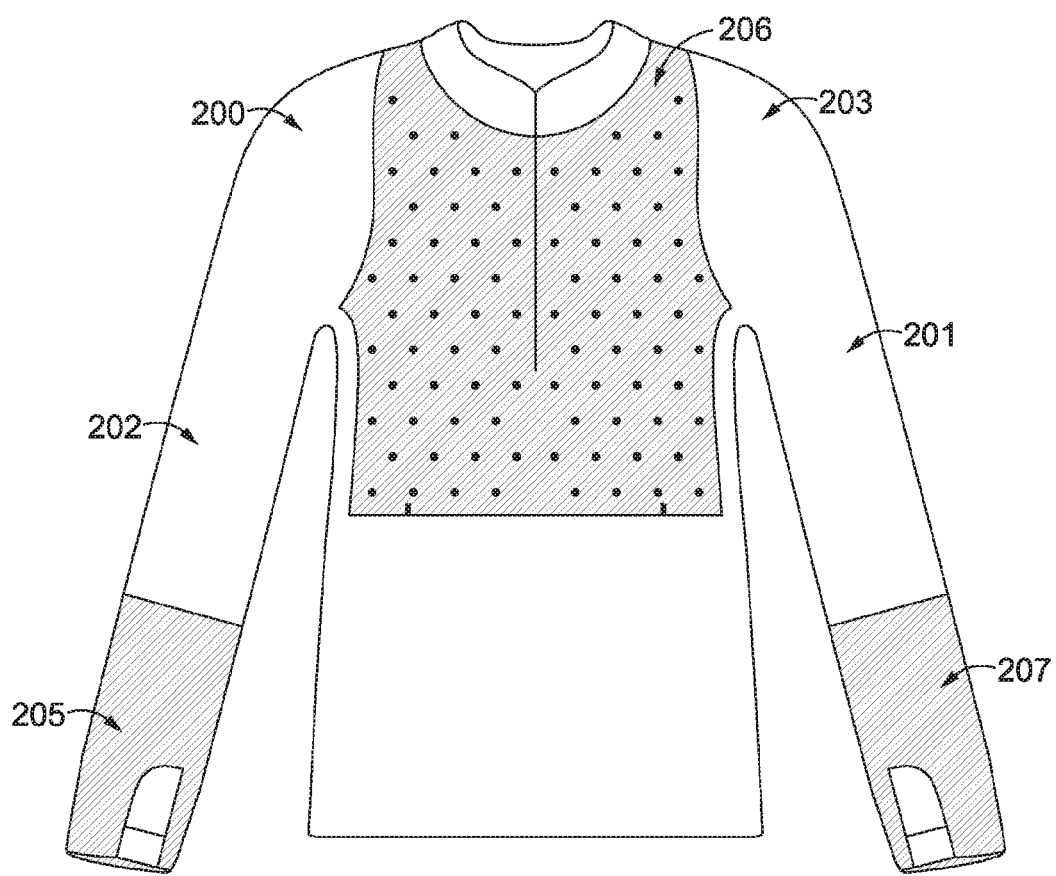
FIG. 5 depicts an exemplary adaptive material garment system with wind-resistant sleeve portions proximate the sleeve cuff, in accordance with aspects hereof.

Turning to FIG. 5, an exemplary adaptive material garment system with wind-resistant sleeve portions 205 and 207 proximate the sleeve cuff, in accordance with aspects hereof, is depicted. Similar to the system 100 of FIG. 1, the system of FIG. 5 is comprised of an inner article (not shown) and an outer article 200. The outer article 200 is comprised of the sleeves 201 and 202 formed from the first material layer 203. The outer article 200 is further comprised of the second layer 206. As an alternative to system 100 of FIG. 1, the wind-resistant sleeve portions 205 and 207, which may be made from a material similar to that of the second layer 206, in an exemplary aspect, are included at the cuff end (e.g., distal end) for one or more of the sleeves 201 and 202. As moisture evacuation may be a lower priority in the cuff region of the sleeves 201 and 202, the wind-resistant sleeve portions 205 and 207 may omit inclusion of apertures to enhance thermal resistance. However, it is contemplated that in an exemplary aspect one or more apertures are included in the wind-resistant sleeve portions 205 and 207.

From the foregoing, it will be seen that this invention is one well adapted to attain all the ends and objects hereinabove set forth together with other advantages which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

The invention claimed is:

1. An adaptive material garment system comprising:
   an inner article in the form of a shirt, the inner article comprised of a first adaptive material that changes from a first physical state to a second physical state in response to a moisture stimulus, the inner article having a first air permeability in the first physical state and a second air permeability in the second physical state, the second air permeability greater than the first air permeability, the inner article having a first denier per yarn; and
   an outer article configured to be layered over the inner article, the outer article comprising:
      a first layer in the form of a shirt having an anterior portion and an opposite posterior portion, the first layer having a first layer inner surface and an opposite first layer outer surface, the first layer comprised of a second adaptive material that changes from a first physical state to a second physical state in response to the moisture stimulus, the first layer having a first air permeability in the first physical state and a second air permeability in the second physical state, the second air permeability greater than the first air permeability, the first layer having a second denier per yarn that is greater than the first denier per yarn; and a second layer formed of a wind-resistant material having a plurality of apertures, the second layer extending across at least a part of the anterior portion of the first layer and having a second layer inner surface and an opposite second layer outer surface, and at least an inferior edge having a first portion, a second portion, and a third portion extending between the first portion and the second portion, the second layer inner surface adjacent to the first layer outer surface, wherein the first portion and the second portion of the inferior edge of the second layer are coupled to the first layer, and wherein the third portion of the inferior edge of the second layer is uncoupled from the first layer.

2. The adaptive material garment system of claim 1, wherein the inner article is comprised of a neck opening with a first sleeve and a second sleeve separated along a superior portion by the neck opening.

3. The adaptive material garment system of claim 1, wherein the first adaptive material has a higher gauge than the second adaptive material.

4. An adaptive material garment system, comprising:
an inner article in the form of an upper-body garment, the inner article having an inner article inner surface and an opposite inner article outer surface, the inner article comprised of a first adaptive material that changes from a first physical state to a second physical state in response to a moisture stimulus, the inner article having a first air permeability in the first physical state and a second air permeability in the second physical state, the second air permeability greater than the first air permeability; and
an outer article configured to be layered over the inner article, the outer article comprising:
a first layer having a first layer inner surface and an opposite first layer outer surface, the first layer inner surface adjacent to the inner article outer surface, the first layer comprised of a second adaptive material that changes from a first physical state to a second physical state in response to the moisture stimulus, the first layer having a first air permeability in the first physical state and a second air permeability in the second physical state, the second air permeability greater than the first air permeability; and
a second layer formed of a wind-resistant material having a plurality of apertures, the second layer overlaying at least a part of an anterior portion of the first layer outer surface, the second layer comprising an inferior edge having a first portion, a second portion, and a third portion extending between the first portion and the second portion, wherein the first portion and the second portion of the inferior edge of the second layer are coupled to the first layer, and wherein the third portion of the inferior edge of the second layer is uncoupled from the first layer.

5. The adaptive material garment system of claim 4, wherein the first layer of the outer article is unaffixed to the inner article.

6. The adaptive material garment system of claim 4, wherein the first adaptive material has a first denier per yarn and the second adaptive material has a second denier per yarn.

7. The adaptive material garment system of claim 6, wherein the first denier per yarn is less than the second denier per yarn.

8. The adaptive material garment system of claim 7, wherein the first denier per yarn is between 40 and 60 denier per yarn.

9. The adaptive material garment system of claim 8, wherein the second denier per yarn is between 65 and 85 denier per yarn.

10. The adaptive material garment system of claim 4, wherein the plurality of apertures extend through a second layer inner surface and a second layer outer surface of the second layer.

11. The adaptive material garment system of claim 10, wherein the plurality of apertures have a diameter between 1 and 3 millimeters.

12. An adaptive material article system comprising:
an inner article in the form of an upper body garment, the inner article comprised of a first adaptive material that exhibits a change in air permeability in response to a moisture stimulus; and
an outer article configured to be layered over the inner article, the outer article comprising:
a first layer comprised of a second adaptive material that exhibits a change in air permeability in response to the moisture stimulus; and
a second layer formed of a wind-resistant material having a plurality of apertures, the second layer extending across at least a part of an anterior portion of a first layer outer surface of the first layer, the second layer comprising an inferior edge having a first portion, a second portion, and a third portion extending between the first portion and the second portion, wherein the first portion and the second portion of the inferior edge of the second layer are coupled to the first layer, and wherein the third portion of the inferior edge of the second layer is uncoupled from the first layer.

13. The adaptive material article system of claim 12, wherein the first adaptive material increases in air permeability in response to the moisture stimulus, and wherein the second adaptive material increases in air permeability in response to the moisture stimulus.

14. The adaptive material garment system of claim 1, wherein the second layer does not comprise an adaptive material.

15. The adaptive material garment system of claim 1, further comprising a reinforcement element surrounding an outer perimeter of at least a portion of the plurality of apertures.

16. The adaptive material garment system of claim 15, wherein the reinforcement element comprises a reflective characteristic.

17. The adaptive material garment system of claim 1, wherein the second layer overlays an upper part of the anterior portion of the first layer.

* * * * *